United States Patent [19]
Villa et al.

[11] Patent Number: 5,721,707
[45] Date of Patent: Feb. 24, 1998

[54] ERASE VOLTAGE CONTROL CIRCUIT FOR AN ELECTRICALLY ERASABLE NON-VOLATILE MEMORY CELL

[75] Inventors: Corrado Villa, Sovico; Marco Dallabora, Carpiano; Marcello Cane, Piobesi D'Alba, all of Italy

[73] Assignee: SGS-Thomson Microelectronics S.r.l., Agrate Brianza, Italy

[21] Appl. No.: 787,907

[22] Filed: Jan. 23, 1997

[51] Int. Cl.[6] ................................. G11C 7/00
[52] U.S. Cl. .................. 365/218; 365/185.29; 365/226
[58] Field of Search .................. 365/218, 185.29, 365/185.01, 226

[56] References Cited

U.S. PATENT DOCUMENTS

| | | | |
|---|---|---|---|
| 5,231,602 | 7/1993 | Radjy et al. | 365/185 |
| 5,365,121 | 11/1994 | Morton et al. | 327/170 |

FOREIGN PATENT DOCUMENTS 2220811  1/1990  United Kingdom ............ G11C 17/00

*Primary Examiner*—David C. Nelms
*Assistant Examiner*—F. Niranjan
*Attorney, Agent, or Firm*—David V. Carlson; Seed and Berry LLP

[57] ABSTRACT

An erase voltage control circuit for an electrically erasable non-volatile memory cell having a control electrode and a first electrode. The circuit includes negative voltage generator means for generating a negative erase voltage to be supplied to the control electrode of the memory cell and means for electrically coupling the first electrode to a voltage supply. The circuit further includes control means for selectively deactivating the negative voltage generator means when a current supplied by the voltage supply to the first electrode of the memory cell reaches a predetermined value.

23 Claims, 2 Drawing Sheets

ERASE VOLTAGE CONTROL CIRCUIT FOR AN ELECTRICALLY ERASABLE NON-VOLATILE MEMORY CELL

TECHNICAL FIELD

The present invention relates to an erase voltage control circuit for an electrically erasable non-volatile memory cell. More particularly, the present invention relates to a circuit integrated in an electrically erasable and programmable non-volatile memory device, particularly a flash EEPROM, for controlling the erase voltage supplied to the memory cells during the electrical erase phase.

BACKGROUND OF THE INVENTION

It is known that flash EEPROMs have memory cells formed by floating-gate MOSFETs. Each floating-gate MOSFET includes an N type source region and an N type drain region both formed in a spaced-apart condition in a P type semiconductor substrate. The portion of the P type substrate located between the source and drain regions forms a channel region, and a floating gate electrode is placed above the channel region with the interposition of a gate oxide layer having thickness of the order of 100 Angstroms. A control gate electrode is insulatively disposed over the floating gate electrode.

A Flash EEPROM memory cell is written by means of injection of hot electrons from a portion of the channel region near the drain region into the floating gate. To activate hot-electron injection, the source region is normally kept grounded, the control gate electrode is biased with a voltage in the range 9-12 V and the drain region is biased with a voltage in the range 4-7 V. The negative charge trapped in the floating gate increases the threshold voltage of the floating-gate MOSFET, i.e., the minimum voltage that must be applied to the control gate electrode to determine the formation of an N type inversion layer in the channel region.

Erasure of the Flash EEPROM memory cell is achieved by means of Fowler-Nordheim (F-N) tunneling of electrons from the floating gate to the source region through the gate oxide layer. To activate F-N tunneling, a sufficiently high electric potential difference between the source region and the floating gate must be created, to develop a strong electric field in the gate oxide layer. A measure of the rate at which electrons are extracted from the floating gate is given by the so-called Fowler-Nordheim (F-N) current, a quantity that depends on the electric field in the gate oxide layer, i.e., on the difference in the potentials of the source electrode and of the floating gate and on the thickness of the gate oxide layer. The higher the F-N current, the shorter the erasing time of the memory cell.

As known, in Flash EEPROMs all the memory cells, or at least large groups of them (called memory sectors), have their respective source regions tied to a common source line. The erasure is thus a global operation simultaneously involving a large number of memory cells.

According to a preferred erasing technique, the electric potential difference between the source regions and the floating gates of the memory cells necessary to activate F-N tunneling is created by applying to the control gate electrodes of the memory cells a negative voltage in the range −8 V to −12 V, generated directly on-chip by means of charge pumps, and connecting the common source line of the memory cells to be erased to the external power supply (VCC supply connected to the VCC pin of the memory device) of the flash EEPROM. In this way, the source electrode bias voltage is provided by the external VCC supply, and the negative voltage for the control gate can be generated directly on-chip by means of charge pumps. This solution is particularly useful in Single Power Supply (SPS) flash EEPROMs, which require a single external supply, i.e., the conventional VCC supply.

The implementation of this erasing technique involves two distinct problems.

A first problem relates to the need for regulating the negative voltage generated by the negative charge pumps to a predetermined value. First of all, it is difficult to determine which could be the most suitable negative voltage value taking into account all the possible variations of parameters, such as the VCC value, the oxide thickness and so on. Secondly, the regulation must be carried out without loading the negative charge pumps, which as known have high output impedances. Furthermore, negative voltages are difficult to handle when simple single well manufacturing processes are employed; level shifters must then be provided at the input of the regulation circuits.

A second problem relates to the fact that, in order to reduce oxide stresses, it is advisable to apply the electric fields gradually during the erasing of the memory cells. This problem is related to the circumstance that, given the electric potential of the control gate and source electrodes of the memory cells, the electric field in the gate oxide layer is not constant, but have a peak at the beginning of erasing caused by the negative charge trapped in the floating gates of the written memory cells.

A known technique to limit the maximum electric field in the gate oxide layer calls for the series connection of a feedback resistor between the external VCC pin of the memory device and the source electrodes of the memory cells. In this way, the voltage drop across the feedback resistor caused by the source current of the memory cells limits the source potential. During erasing the source current is substantially represented by the so-called Band-to-Band Tunneling current (BBT current), due to electrons of the source regions which tunnel from the valence band to the conduction band. The BBT current is several orders of magnitude higher than the F-N current, but these two currents depend in a similar way on the same parameters, i.e., also the BBT current depends on the electric field in the gate oxide layer, so that a reduction of the source current determines a corresponding reduction in the electric field in the gate oxide layer. At the beginning of erasing, the voltage drop across the feedback resistor is maximum, then as electrons are extracted from the floating gate the potential of the floating gate raises, the electric field in the gate oxide layer decreases and the BBT current diminishes. The voltage drop across the feedback resistor also decreases, and the potential of the source regions of the memory cells raises toward the VCC value. In the final phases of erasure, when the BBT current is low, the potential of the source regions is substantially equal to VCC.

However, since the source potential controls only partially the electric potential difference between the floating gate and the source electrode, this technique is not very effective.

SUMMARY OF THE INVENTION

In view of the state of art described, it is an object of the present invention to provide a control circuit for controlling the erase voltage applied to an electrically erasable memory cell in a way suitable to limit the maximum electric field in the gate oxide layer of the memory cell, which overcomes the above-mentioned problems.

According to the present invention, such object is attained by means of an erase voltage control circuit for an electrically erasable non-volatile memory cell having a control electrode and a first electrode. The circuit includes negative voltage generator means for generating a negative erase voltage to be supplied to the control electrode of the memory cell and means for electrically coupling the first electrode to a voltage supply. Further, the circuit includes means for selectively deactivating the negative voltage generator means when a current supplied by the voltage supply to the first electrode of the memory cell reaches a predetermined value.

Thanks to the present invention, it is possible to limit the maximum electric field in the gate oxide layer of the memory cell during the erasing phase. This is made possible by monitoring the current supplied by the voltage supply to the first electrode (source electrode) of the memory cell; as previously mentioned, the source current of the memory cell during the erasing phase is substantially equal to the BBT current, which in turn depends on the electric field in the gate oxide layer of the memory cell. By deactivating the negative voltage generator means which supply the negative erase voltage to the control electrode of the memory cells when the BBT current reaches a predetermined value, the maximum electric field in the gate oxide layer of the memory cell never exceeds a maximum value depending on said predetermined value of the BBT current. Such predetermined value of the BBT current is chosen at a design level on the basis of a trade-off between the maximum desired electric field value in the gate oxide layer of the memory cell and the desired F-N current.

BRIEF DESCRIPTION OF THE DRAWINGS

These and other features and advantages of the present invention will be made more evident by the following detailed description of a particular embodiment, illustrated as a non-limiting example in the annexed drawings.

DETAILED DESCRIPTION OF THE INVENTION

Figure 1:
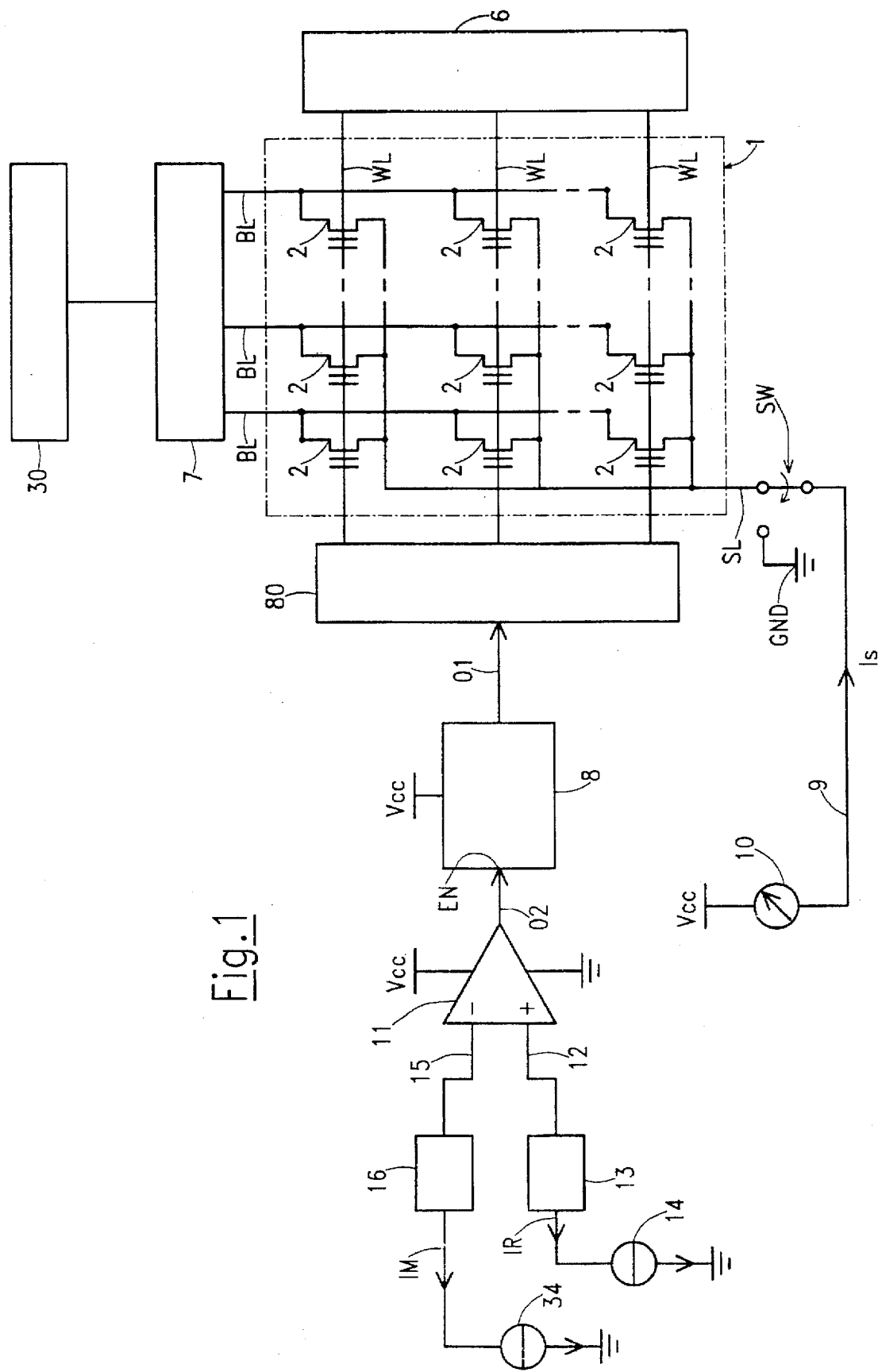
FIG. 1 is a schematic diagram of a control circuit according to the present invention integrated in a memory device.

In FIG. 1 a control circuit according to the invention integrated in a flash EEPROM is shown schematically. Conventionally, the Flash EEPROM comprises an array 1 of memory cells 2 arranged in rows (word lines) WL and columns (bit lines) BL.

The memory cells 2 are formed by floating-gate MOSFETs. As known, each floating-gate MOSFET comprises an N type source region and an N type drain region both formed in a spaced-apart condition in a P type semiconductor substrate. The portion of the P type semiconductor substrate comprised between the source and drain regions forms a channel region, and a floating gate electrode is placed above the channel region with the interposition of a gate oxide layer having thickness suitable to allow tunneling of electrons from the floating gate to the source region when a suitable electric field is built up in the gate oxide layer (for example, an oxide layer with thickness of the order of 100 Angstroms). A control gate electrode is insulatively disposed over the floating gate electrode.

Each memory cell 2 has the drain region coupled to a respective bit line BL, the control gate electrode coupled to a respective word line WL and the source region coupled, together with the source regions of all the other memory cells 2, to a common source line SL.

The array 1 of memory cells can be for example one memory sector of the Flash EEPROM; as known, Flash EEPROMs can comprise several sectors of memory cells, and each memory sector can be erased independently from the others. In a given memory sector, the memory cells have the source regions commonly connected to a same source line SL, but the common source lines of the different memory sectors are not connected to each other, to allow independent memory sector erasing.

Also schematically shown in FIG. 1 are a row decoder 6 and a column decoder 7 which allow the selection of one word line WL and one bit line BL, respectively. The detailed circuit structure of the row and column decoders is not shown, since these circuits are conventional.

The column decoder 7 which allows the electrical connection of one of the bit lines BL to a sensing circuit 30, is also conventional.

The control circuit of the invention includes a negative voltage generator 8 for generating a negative voltage to be supplied to the word lines WL during the erasing phase of the array 1 of memory cells. The negative voltage generator 8 comprises a negative charge pump circuit designed to generate a negative voltage with values ranging from −8 V to −12 V starting from the voltage provided by an external power supply, indicated in the drawings by VCC. The external power supply VCC is typically a 5 V nominal power supply (actually, 5 V +/−10%, which means that the external power supply can have values in the range 4.5–5.5 V), but could also be a 3 V nominal power supply (3 V +/−10%, i.e., with values in the range 2.7–3.3 V). An output O1 of the negative voltage generator 8 is coupled to the word lines WL through a decoupling circuit 80 which allows the word lines WL to be electrically disconnected from the output O1 of the negative voltage generator 8 when the memory device is not in the erasing phase, i.e., when the negative voltage generator 8 is deactivated.

Also schematically shown in FIG. 1 is a switch SW which allows for alternatively connecting the common source line SL to a reference voltage GND (ground) or to a line 9 coupled to the external power supply VCC. The line 9 is coupled to the external power supply VCC through a current measuring circuit 10.

The negative voltage generator 8 has an enable input EN connected to an output O2 of a conventional comparator 11. A non-inverting input 12 of comparator 11 is supplied with an output of a first current-voltage converter 13 which is in turn supplied with a reference current IR generated by a first, reference current generator 14. An inverting input 15 of comparator 11 is supplied with an output of a second current-voltage converter 16 which is in turn supplied with a current IM generated by a second current generator 34. Current IM is generically proportional to the current measured by the current measuring circuit 10, in particular current IM can be equal to the current measured by the measuring circuit 10. The current-voltage converters 13 and 16 are of the type such that their output voltages are proportional to the currents supplied at their inputs, respectively IR and IM, and in particular the current-voltage converters are such that the higher the currents supplied at their inputs, the lower their output voltages. Also, the two current-voltage converters 13, 16 can have different conversion factors, so that if for example current IM is chosen to be equal to the current measured by the circuit 10, it is not necessary to generate a reference current IR equal to said measured current (which is typically rather high) to have same voltage values at the inputs of comparator 11.

Figure 2:
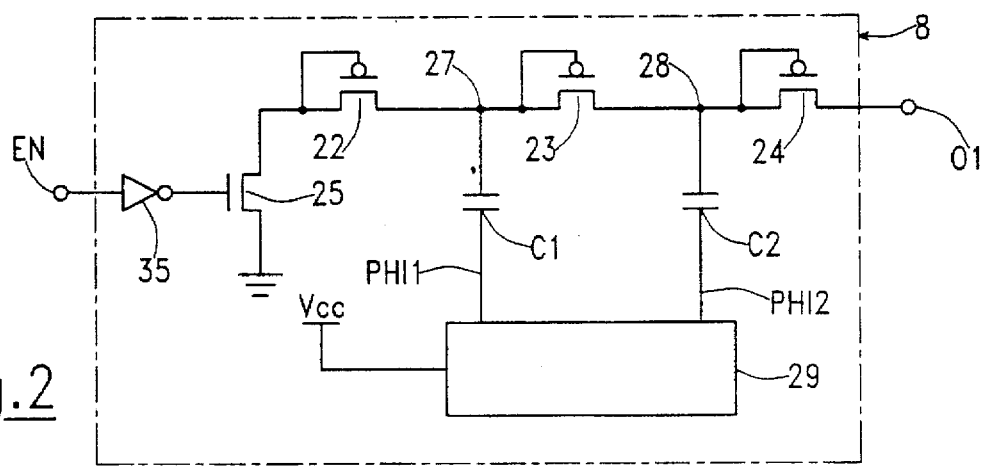
FIGS. 2 and 3 are detailed circuit diagrams showing a possible practical embodiment of the control circuit of FIG. 1.
Figure 3:
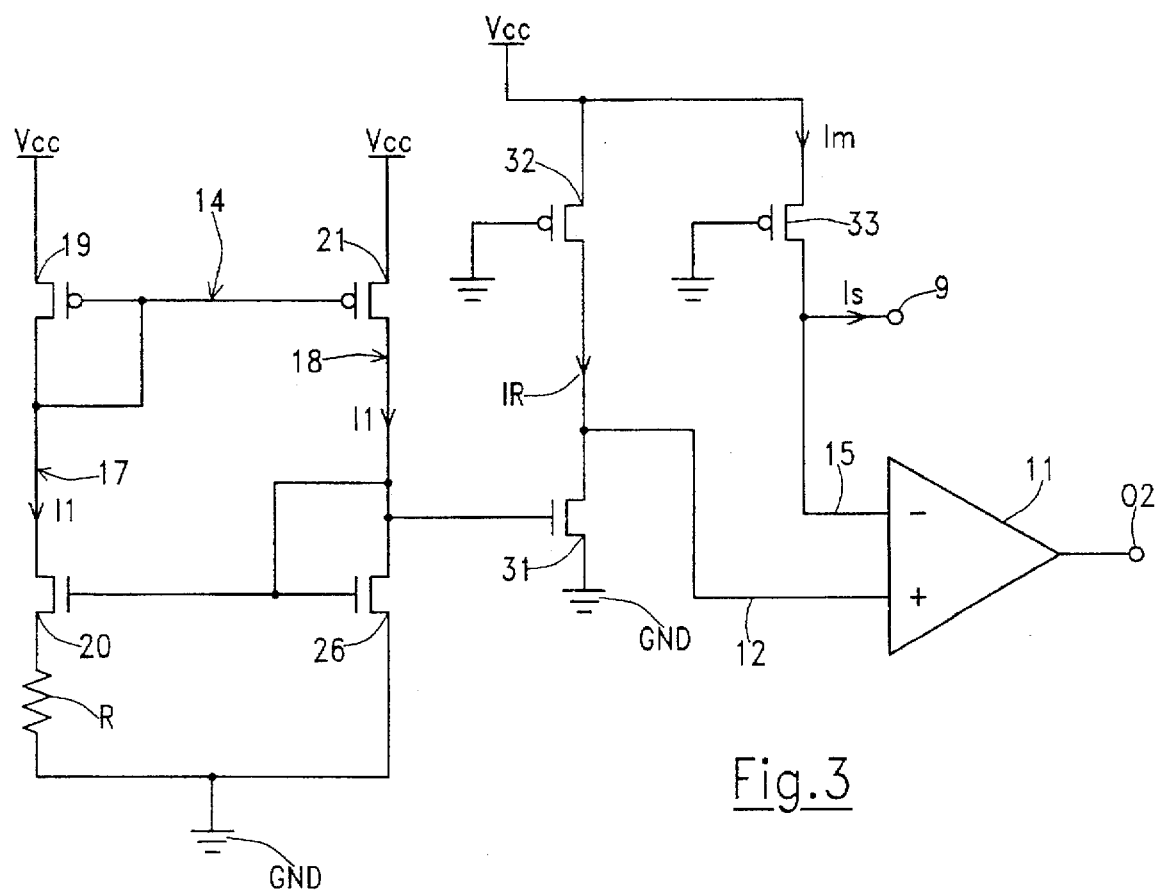

FIGS. 2 and 3 are detailed circuit diagrams showing a practical embodiment of the control circuit schematically shown in FIG. 1.

More specifically, FIG. 2 is a detailed circuit diagram of the negative voltage generator 8. The negative voltage generator 8 comprises a negative charge pump circuit comprising a chain of diode-connected P-channel MOSFETs 22, 23 and 24. The first P-channel MOSFET 22 of the chain has a drain electrode connected to ground through an N-channel MOSFET 25 whose gate electrode is controlled by an inverter 34 whose input forms in turn the enable input EN of the negative voltage generator. A first capacitor C1 has one plate connected to the common node 27 of MOSFETs 22 and 23, and the other plate supplied with a first clock signal PHI1. A second capacitor 2 has one plate connected to the common node 28 between MOSFETs 23 and 24, and the other plate supplied with a second clock signal PHI2. The clock signals PHI1, PHI2 are generated by a conventional clock generator 29, supplied by the external voltage supply VCC. The clock signals PHI1, PHI2 are digital signals switching between ground and the external power supply VCC, and they are substantially in phase opposition. The source electrode of MOSFET 24 forms the output O1 of the negative voltage generator 8.

FIG. 3 is a detailed circuit diagram of the current measuring circuit 10, of the reference current generator 14 and of the current-voltage converters 13, 16. The reference current generator is a current mirror comprising a first branch 17 and a second branch 18. The first branch comprises a P-channel MOSFET 19 with a source electrode connected to VCC and a gate tied to a drain electrode, an N-channel MOSFET 20 in series to MOSFET 19 and a resistor R in series between a source electrode of MOSFET 20 and ground GND. The second branch 18 comprises a P-channel MOSFET 21 with a source electrode connected to VCC, a gate electrode connected in current-mirror configuration to the gate of MOSFET 19, and an N-channel MOSFET 26 with a drain electrode tied to a gate electrode and connected in current-mirror configuration to the gate electrode of MOSFET 20 and a source electrode connected to the ground GND. By way of example, MOSFETs 19, 20, 21 and 26 can have aspect ratios (channel width/channel length) respectively equal to 1, 7, 1 and 1, and resistor R can have a value of approximately 30 kohm.

The gate electrode of MOSFET 26 controls a gate electrode of an N-channel MOSFET 31 with a source electrode connected to the ground GND and a drain electrode coupled to the external power supply VCC through a load formed by a permanently-on P-channel MOSFET 32 with a gate electrode tied to ground. Again, by way of example, MOSFETs 31 and 32 can have aspect ratios respectively equal to 1 and 2. The drain electrode of MOSFET 31 is connected to the non-inverting input 12 of comparator 11.

The line 9, to which the common source line SL is coupled during erasing, is coupled to the external power supply VCC by means of a permanently-on P-channel MOSFET 33 with a gate electrode tied to ground. By way of example, MOSFET 33 can have an aspect ratio of approximately 100, to sustain the source current IS of the memory array in the erasing phase without obtaining a voltage drop that is too high. The inverting input 15 of comparator 11 is also coupled to VCC through MOSFET 33.

Resistor R and MOSFET 19 determine a constant current I1 to flow through branch 17 of the current mirror 14; this current is replicated in branch 18 by the current-mirror connection of MOSFETs 21 and 26. The constant current I1 in branch 18 establishes a biasing voltage which is supplied to the gate electrode of MOSFET 31. With such biasing voltage, MOSFET 31 drains a constant current IR which forms the reference current. MOSFET 32 forms the current-voltage converter 13, and converts current IR in a constant reference voltage which is supplied to the non-inverting input 12 of comparator 11. MOSFET 33 forms the current-measuring circuit 10, and performs the functions of generating the current IM shown in FIG. 1 and of the current-voltage converter 16.

The value of IR is chosen in such a way that, taking into account the different dimensions of MOSFETs 32 and 33, during the erasing phase when the source current IS (i.e., the BBT current) reaches and exceeds a predetermined maximum desired value, the voltage drop across MOSFET 33 exceeds the voltage drop across MOSFET 32, and the output of comparator 11 switches from a low logic level to a high logic level, thus causing the negative voltage generator to turn off. Since the aspect ratio of MOSFET 32 is approximately fifty times smaller than that of MOSFET 33, the reference current IR can be fifty times smaller than the predetermined maximum desired value of IS during the erasing phase. The predetermined maximum desired value of source current IS is chosen based on a trade off between the maximum acceptable electric field in the gate oxide layer of the memory cells and the desired Fowler-Nordheim (F-N) current.

The operation of the control circuit previously described will now be explained making reference to the schematic diagram of FIG. 1.

First of all, it should be kept in mind that conventionally, prior to activating any erase phase, all the memory cells 2 in the memory array 1 are programmed. This step assures that all the memory cells start from a common programmed condition, and avoids some memory cells being depleted, acquiring a negative threshold voltage.

After this common programming, the row decoder 6 is disabled, so that the word lines WL are coupled to the output O1 of the negative voltage generator 8; the column decoder 7 is also deactivated to leave all the bit lines BL floating. The common source line SL of the memory array 1 is coupled to the external power supply VCC.

At the beginning of the erasing phase, the negative voltage generator 8 is off (the N-channel MOSFET 25 in FIG. 2 is off); the word lines WL are at a potential substantially equal to the ground potential. In this biasing condition, the electric field in the gate oxide layer of the memory cells is not sufficient to trigger Fowler-Nordheim tunneling of electrons from the floating gates to the source regions of the memory cells; also the Band-to-Band (BBT) current is therefore substantially zero. Since the source current IS drained from the VCC external power supply in the erasing phase is substantially equal to the BBT current, the source current IS is also substantially zero; this current is measured by the current measuring circuit 10. The current generator 34 generates a current IM which is also substantially equal to zero. The reference current generator 14 instead generates a constant reference current IR. Since current IM is lower than the reference current IR, the voltage at the non-inverting input 15 of the comparator 11 is higher than the voltage at the inverting input 12, and the output O2 of the comparator 11 is at a low logic level (equal to GND). The enable input EN of the negative voltage generator 8 is thus at a low logic level, so that the N-channel MOSFET 25 turns on, activating the negative charge pump circuit.

The negative charge pump circuit generates at its output O1 a negative voltage that progressively becomes more and more negative, approaching a steady-state value approximately equal to −2 VCC, and this negative voltage is supplied to the word lines WL. The voltage of the word lines becomes progressively more negative, and when a sufficient electric field has been built in the gate oxide layer of the memory cells, F-N tunneling of electrons from the floating gates to the source regions triggers on, and the F-N current increases; simultaneously, due to band-to-band tunneling, the BBT current increases.

When the reference current IR, the proportionality factor of current IM with respect to IS, and the conversion factor of the current-voltage converter 13 have respective values chosen in such a way that the voltage at the non-inverting input 12 of comparator 11 is equal to the voltage at the inverting input 15 when current IS (i.e., the BBT current) reaches a maximum desired value (such a maximum desired value being chosen on the basis of a trade-off between the desired F-N current and the maximum acceptable electric field), then when IS exceeds this maximum desired value, (i.e. when the voltage of the word lines has become so negative to cause a too high of an electric field in the gate oxide layer of the memory cells and a correspondingly too high of a BBT current), the voltage at the inverting input 15 of comparator 11 becomes lower than the voltage at the non-inverting input 12, and comparator 11 switches causing the negative voltage generator 8 to mm off (the N-channel MOSFET 25 is mined off). In this way, the voltage of the word lines WL stops becoming more negative, but F-N tunneling of electrons from the floating gates to the source regions of the memory cells goes on.

When the electric field in the gate oxide layer of the memory cells decreases due to the fact that electrons have been extracted from the floating gates of the memory cells, the BBT current decreases, and the voltage at the inverting input 15 of comparator 11 again becomes higher than the voltage at the non-inverting input 12. Comparator 11 switches again, turning the negative voltage generator on. The voltage of the word lines WL again starts becoming more negative, until the value of the electric field in the gate oxide layer of the memory cells is such that the BBT current (and thus the source current IS) exceeds the maximum predetermined value, again causing the comparator 11 to switch the negative voltage generator off. This process goes on until the memory cells have been erased.

The negative voltage supplied to the word lines WL varies in time as a linear ramp such that, during the entire erasing phase, the electric field in the gate oxide layer of the memory cells has a substantially constant value independent from the potential applied to the source regions of the memory cells. The value of the electric field depends in fact on the value of the reference current, i.e., on the maximum desired value chosen for the BBT current.

In this way, the voltage of the control gates of the memory cells is automatically adjusted to a value sufficient to maintain the desired electric field in the gate oxide layer of the memory cells. The control circuit of the present invention generates an absolute reference current IR, but involves handling of positive voltages.

The peak in the electric field value at the beginning of the erasing phase (when the floating gate of the memory cells is more negative due to the presence of electrons trapped therein) is eliminated, because the circuit, maintaining a constant BBT current equal to a desired maximum value, automatically limits the electric field value during all the erasing phase. In this way, the initial peak in the source current is eliminated, and it is not necessary to provide current limiting means, such as the feedback resistor used in the prior art, in series between the VCC external voltage and the common source line SL. Eliminating the source current, and thus the need for providing current limiting means, increases the efficiency of the erasing process in the final steps of the erasing phase, and eliminates the dependence on parameters such as the gate oxide thickness and the capacitive couplings of the memory cells. Power losses are also reduced because no feedback resistance is provided. In addition, the power consumption of the negative voltage generator is reduced, because the negative charge pump works only when strictly necessary.

Also, possible variations of the external supply voltage VCC do not affect the erasing process, because they are compensated by a corresponding increase (in absolute value) of the voltage of the control gates, so that the BBT current is maintained at the desired value.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. An erase voltage control circuit for an electrically erasable non-volatile memory cell having a control electrode and a first electrode, the circuit comprising:
   negative voltage generator means for generating a negative erase voltage to be supplied to said control electrode of the memory cell;
   contact means for electrically coupling said first electrode to a voltage supply; and
   control means for selectively deactivating said negative voltage generator means when a current supplied by said voltage supply to said first electrode of the memory cell reaches a predetermined value.

2. The erase voltage control circuit according to claim 1 wherein said control means for selectively deactivating the negative voltage generator means further includes comparator means for comparing a first current proportional to said current supplied by the voltage supply to the first electrode of the memory cell with a second current proportional to said predetermined value, said comparator means controlling the activation and deactivation of said negative voltage generator means.

3. The erase voltage control circuit according to claim 2, further including:
   measuring means for measuring the current supplied by said voltage supply to said first electrode of the memory cell;
   first current generator means for generating said first current proportional the current measured by said measuring means; and
   second current generator means for generating said second current.

4. The erase voltage control circuit according to claim 3, further including first current-voltage conversion means for converting said first current into a first voltage supplied to a first input of said comparator means, and second current-voltage conversion means for converting said second current into a second voltage supplied to a second input of said comparator means.

5. The erase voltage control circuit according to claim 4 wherein said measuring means, said first current generator means and said first current-voltage conversion means are constituted by first load means connected in series between said voltage supply and the first electrode of the memory cell, the first electrode being connected to said first input of the comparator means.

6. The erase voltage control circuit according to claim 5 wherein said first load means comprise a first load transistor having a first electrode connected to said voltage supply and a second electrode connected to said first electrode of the memory cell.

7. The erase voltage control circuit according to claim 6 wherein said second current-voltage conversion means are constituted by second load means connected in series between said voltage supply and said second current generator means.

8. The erase voltage control circuit according to claim 7 wherein said second load means comprise a second load transistor having a first electrode connected to said voltage supply and a second electrode connected to said first electrode of the memory cell and to said second input of said comparator means.

9. The erase voltage control circuit according to claim 8 wherein said second current generator means comprise transistor means having a first electrode connected to the second electrode of the second load transistor, a second electrode connected to a ground voltage and a control electrode supplied with a voltage generated by a bias voltage generator circuit.

10. The erase voltage control circuit according to claim 9 wherein said bias voltage generator circuit is a current-mirror circuit comprising a first circuit branch traversed by a fixed current, and a second circuit branch traversed by a current proportional to said fixed current and for generating said bias voltage.

11. An electrically erasable and programmable non-volatile memory device, comprising:
at least one memory sector having an array of memory cells located at the intersections of rows and columns of the array, each memory cell having a control electrode connected to one of said rows, a first electrode connected to a common line and a second electrode connected to one of said columns;
negative voltage generator means for generating a negative erase voltage to be supplied to said control electrode of the memory cell;
means for electrically coupling said first electrode to a voltage supply; and
control means for selectively deactivating said negative voltage generator means when a current supplied by said voltage supply to said first electrode of the memory cell reaches a predetermined value.

12. The electrically erasable and programmable non-volatile memory device according to claim 11 comprising means for selectively coupling said common line to the voltage supply, said negative voltage generator means supplying, when activated, a negative voltage to said rows of the array and being deactivated when a current that is supplied by said voltage supply to said common line reaches a predetermined value.

13. The electrically erasable and programmable non-volatile memory device according to claim 12 wherein said voltage supply is an external voltage supply of the memory device.

14. The electrically erasable and programmable non-volatile memory device according to claim 13 wherein said external voltage supply is the only external voltage supply of the memory device.

15. A method for erasing an electrically erasable non-volatile memory cell having a control electrode and a first electrode, comprising the steps of:
supplying the first electrode with a first voltage;
supplying the control electrode of the memory cell with a second, negative voltage;
progressively increasing said negative voltage in absolute value as long as a current supplied by said first voltage to the first electrode of the memory cell does not reach a predetermined value; and
temporarily stopping the progressive increase in absolute value of said negative voltage as long as the current is equal to said predetermined value.

16. A voltage-control circuit for erasing a non-volatile memory cell having a control electrode and a first electrode, the circuit comprising:
a negative voltage generator circuit having an input node and output node, said output node coupled to said control electrode of the memory cell;
a switching component coupled between said first electrode and a supply terminal; and
a comparator circuit coupled to said input node for comparing a first current proportional to said current supplied by the supply terminal to the first electrode of the memory cell with a second current proportional to said predetermined value, said comparator circuit controlling the activation and deactivation of said negative voltage generator circuit.

17. The voltage control circuit of claim 16, further including a sensing circuit coupled between said supply terminal and said switching component, said sensing circuit measuring the current flowing between said supply terminal and said first electrode of the memory cell.

18. The voltage control circuit of claim 16, further including first and second current generator circuits respectively coupled to an inverting and a non-inverting input of said comparator circuit, said first generator circuit providing said first current and said second current generator circuit providing said second current.

19. The voltage control circuit of claim 18, further including first and second current-voltage conversion circuits respectively coupled between said first and second current generator circuits and said inverting and non-inverting inputs of said comparator circuit.

20. The voltage control circuit of claim 17 wherein said sensing circuit further includes a first load transistor coupled in series between said supply voltage terminal and the first electrode of the memory cell, said first electrode being coupled to a first input of said comparator circuit, and a second load transistor coupled in series between said supply voltage terminal and said second current generator circuit.

21. The voltage control circuit of claim 18 wherein said second current generator circuit further includes a transistor having a first electrode coupled to the second electrode of the second load transistor, a second electrode coupled to a reference potential and a control electrode supplied with a biased voltage.

22. The voltage control circuit of claim 21 wherein said biased voltage is generated by a current mirror circuit.

23. The voltage control circuit of claim 22 wherein said current-mirror circuit further includes a first circuit branch through which a fixed current flows, and a second circuit branch through which a current proportional to said fixed current flows, said second circuit for generating said bias voltage.

* * * * *

UNITED STATES PATENT AND TRADEMARK OFFICE
CERTIFICATE OF CORRECTION

PATENT NO. : 5,721,707
DATED : February 24, 1998
INVENTOR(S) : Corrado Villa, Marco Dallabora and Marcello Cane It is certified that error appears in the above-identified patent and that said Letters Patent is hereby corrected as shown below:

```
On the title page, insert the following:
```

--Foreign Application Priority Data - European Patent Application No. 96830025.1 filed January 24, 1996.--

Signed and Sealed this

Seventh Day of July, 1998

Attest:

BRUCE LEHMAN

*Attesting Officer*    *Commissioner of Patents and Trademarks*